(12) United States Patent
Son et al.

(10) Patent No.: US 9,634,074 B2
(45) Date of Patent: Apr. 25, 2017

(54) TRANSPARENT DISPLAY SUBSTRATES, TRANSPARENT DISPLAY DEVICES AND METHODS OF MANUFACTURING TRANSPARENT DISPLAY DEVICES

(71) Applicant: Samsung Display Co., LTD., Yongin-si, Gyeonggi-do (KR)

(72) Inventors: Yong-Duck Son, Seongnam-si (KR); Ji-Youn Lee, Anyang-si (KR); Dae-Woo Lee, Hwaseong-si (KR); Jae Beom Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/016,241

(22) Filed: Feb. 4, 2016

(65) Prior Publication Data

US 2016/0233289 A1    Aug. 11, 2016

(30) Foreign Application Priority Data

Feb. 5, 2015  (KR) .................. 10-2015-0017990

(51) Int. Cl.
*H01L 27/32*    (2006.01)
*H01L 51/52*    (2006.01)

(52) U.S. Cl.
CPC ........ *H01L 27/3258* (2013.01); *H01L 27/326* (2013.01); *H01L 51/52* (2013.01); *H01L 2251/558* (2013.01)

(58) Field of Classification Search
CPC .... H01L 27/3258; H01L 51/52; H01L 27/326
See application file for complete search history.

(56) References Cited

U.S. PATENT DOCUMENTS

| 7,242,398 | B2* | 7/2007 | Nathan | H01L 27/3244 345/206 |
| 7,871,868 | B2* | 1/2011 | Wang | H01L 27/1288 257/59 |
| 8,436,356 | B2* | 5/2013 | Lee | H01L 27/12 257/59 |
| 9,006,717 | B2* | 4/2015 | Kim | H01L 27/1218 257/40 |
| 9,337,211 | B2* | 5/2016 | Kim | H01L 27/1259 |
| 9,478,594 | B2* | 10/2016 | Odaka | H01L 27/3258 |
| 2008/0110862 | A1 | 5/2008 | Kim et al. | |

FOREIGN PATENT DOCUMENTS

| JP | 5523363 B2 | 4/2014 |
| KR | 10-2007-0050797 A | 5/2007 |
| KR | 10-2010-0001885 A | 1/2010 |

* cited by examiner

*Primary Examiner* — William Coleman
(74) *Attorney, Agent, or Firm* — Lewis Roca Rothgerber Christie LLP

(57) ABSTRACT

A transparent display substrate including a base substrate having a pixel area and a transmission area, a thickness of the base substrate at the transmission area being less than a thickness of the base substrate at the pixel area, a pixel circuit at the pixel area of the base substrate, an insulation structure covering the pixel circuit, the insulation structure having an opening or a concave portion at the transmission area of the base substrate, and a pixel electrode at the pixel area of the base substrate and extending at least partially through the insulation structure to be electrically connected to the pixel circuit.

20 Claims, 11 Drawing Sheets

TRANSPARENT DISPLAY SUBSTRATES, TRANSPARENT DISPLAY DEVICES AND METHODS OF MANUFACTURING TRANSPARENT DISPLAY DEVICES

CROSS-REFERENCE TO RELATED APPLICATION

This application claims priority to and the benefit of Korean Patent Application No. 10-2015-0017990, filed on Feb. 5, 2015, in the Korean Intellectual Property Office (KIPO), the entire disclosure of which is incorporated by reference herein.

BACKGROUND

1. Field

Aspects of example embodiments relate to transparent display substrates, transparent display devices, and methods of manufacturing transparent display devices.

2. Description of the Related Art

Recently, a display device, such as an organic light emitting diode (OLED) display device, having transparent or transmitting properties has been developed.

Various parameters including composition, arrangement, or thickness of a substrate, an electrode, an insulating layer (e.g., insulative layer), etc., may be controlled so as to obtain a transparent display device. The OLED display device may include a plurality of insulating layers and conductive layers, which may be formed of different materials, and thus the transmitting property may not be easily realized.

SUMMARY

Aspects of example embodiments are directed to transparent display substrates each having a transmission area and a pixel area, transparent display devices including the same, and methods of manufacturing the transparent display devices.

Aspects of example embodiments are directed to a transparent display substrate having an improved (e.g., increased) transmittance.

Aspects of example embodiments are directed to a transparent display device having an improved transmittance.

Aspects of example embodiments are directed to a method of manufacturing a transparent display device having an improved transmittance.

According to example embodiments, there is provided a transparent display substrate including: a base substrate having a pixel area and a transmission area, a thickness of the base substrate at the transmission area being less than a thickness of the base substrate at the pixel area; a pixel circuit at the pixel area of the base substrate; an insulation structure covering the pixel circuit, the insulation structure having an opening or a concave portion at the transmission area of the base substrate; and a pixel electrode at the pixel area of the base substrate and extending at least partially through the insulation structure to be electrically connected to the pixel circuit.

In an embodiment, the base substrate comprises a transparent polymer material selected from polyimide, polysiloxane, an epoxy-based resin, and polyester.

In an embodiment, the thickness of the base substrate at the transmission area is about ¼ to about ½ of the thickness of the base substrate at the pixel area.

In an embodiment, the insulation structure includes a barrier layer, a gate insulation layer, an insulating interlayer, and a via insulation layer sequentially stacked from a top surface of the base substrate, wherein the pixel circuit includes: an active pattern on the barrier layer; a gate electrode on the gate insulation layer, the gate electrode being over the active pattern; and a source electrode and a drain electrode extending through the insulating interlayer and the gate insulation layer to be electrically connected to the active pattern, and wherein the pixel electrode extends through the via insulation layer.

In an embodiment, the barrier layer and the gate insulation layer extend commonly and continuously at the pixel area and the transmission area, the insulating interlayer is at the pixel area, the via insulation layer covers a top surface and a sidewall of the insulating interlayer, and the opening is formed through the via insulation layer.

In an embodiment, the barrier layer extends commonly and continuously at the pixel area and the transmission area, the insulating interlayer is at the pixel area, the via insulation layer covers a top surface and a sidewall of the insulating interlayer, the opening is formed through the via insulation layer, and the opening creates a gap in the gate insulation layer at the transmission area.

In an embodiment, the barrier layer, the gate insulation layer, and the insulating interlayer extend commonly and continuously at the pixel area and the transmission area, the insulating interlayer has relatively less thickness at the transmission area than the pixel area, the opening is through the via insulation layer, and a portion of the insulating interlayer having relatively less thickness is exposed through the opening.

In an embodiment, the via insulation layer includes the concave portion at the transmission area.

In an embodiment, the base substrate has a recess at the transmission area, and the barrier layer extends along an inner wall of the recess and partially fills the recess.

According to example embodiments, there is provided a transparent display device including: a base substrate having a pixel area and a transmission area, the base substrate having a recess in the transmission area; a pixel circuit at the pixel area of the base substrate; an insulation structure covering the pixel circuit and having an opening or a concave portion over the recess; a pixel electrode at the pixel area of the base substrate and extending at least partially through the insulation structure to be electrically connected to the pixel circuit; a display layer on the pixel electrode; and an opposing electrode opposite the pixel electrode on the display layer.

In an embodiment, the opposing electrode extends continuously at the pixel area and the transmission area, and a portion of the opposing electrode on an inner wall of the opening has less thickness than a remaining portion of the opposing electrode.

In an embodiment, the display layer includes a hole transport layer, an organic emitting layer and an electron transport layer sequentially stacked on the pixel electrode, the hole transport layer and the electron transport layer extend continuously at the pixel area and the transmission area, and conformally along an inner wall of the opening, and the organic emitting layer is at the pixel area.

In an embodiment, the opposing electrode and the display layer are at the pixel area.

In an embodiment, the transparent display device further includes an encapsulation film on the opposing electrode, wherein the encapsulation film is in contact with an inner wall of the opening.

In an embodiment, the insulation structure includes a plurality of layers, and a total thickness and a number of the plurality of layers at the transmission area are less than those of the plurality of layers at the pixel area.

In an embodiment, a depth of the recess is about ½ to about ¾ of a thickness of the base substrate.

According to example embodiments, there is provided a method of manufacturing a transparent display device, including: forming a base substrate divided into a pixel area and a transmission area, the base substrate including a transparent polymer material; removing an upper portion of the base substrate in the transmission area to form a recess; forming a barrier layer along a top surface of the base substrate and an inner wall of the recess; forming a pixel circuit on a portion of the barrier layer at the pixel area; forming an insulation layer covering the pixel circuit on the barrier layer; at least partially removing the insulation layer at the transmission area to form an opening; forming a pixel electrode on a portion of the insulation layer at the pixel area, the pixel electrode being electrically connected to the pixel circuit; forming a display layer on the pixel electrode; and forming an opposing electrode on the display layer.

In an embodiment, removing the upper portion of the base substrate in the transmission area to form the recess includes exposing a portion of the base substrate at the transmission area through a half-tone mask.

In an embodiment, the insulation layer includes a gate insulation layer, an insulating interlayer, and a via insulation layer sequentially stacked on the barrier layer, wherein forming the pixel circuit includes: forming an active pattern on the barrier layer; forming a gate electrode on the gate insulation layer, the gate electrode being over the active pattern; partially removing the insulating interlayer and the gate insulation layer to form contact openings and a trench, the contact openings exposing the active pattern at the pixel area, the trench overlapping the recess at the transmission area; and forming a source electrode and a drain electrode filling the contact openings.

In an embodiment, the method further includes partially removing the via insulation layer to form a via opening through which the drain electrode is exposed, wherein the opening is formed in the via insulation layer to be connected to or merged with the trench, and the opening is formed together with the via opening by a same etching process.

BRIEF DESCRIPTION OF THE DRAWINGS

Example embodiments will be more clearly understood from the following detailed description taken in conjunction with the accompanying drawings.

FIG. 1 is a schematic top plan view illustrating a transparent display substrate in accordance with some example embodiments of the present invention;

FIG. 2 is a cross-sectional view illustrating a transparent display substrate in accordance with some example embodiments of the present invention;

FIGS. 3-5 are cross-sectional views illustrating transparent display substrates in accordance with some example embodiments of the present invention;

FIG. 6 is a cross-sectional view illustrating a transparent display device in accordance with some example embodiments of the present invention;

FIGS. 7-8 are cross-sectional views illustrating transparent display devices in accordance with some example embodiments of the present invention; and FIGS. 9-20 are cross-sectional views illustrating a method of manufacturing a transparent display device in accordance with some example embodiments of the present invention.

DETAILED DESCRIPTION

Figure 1:
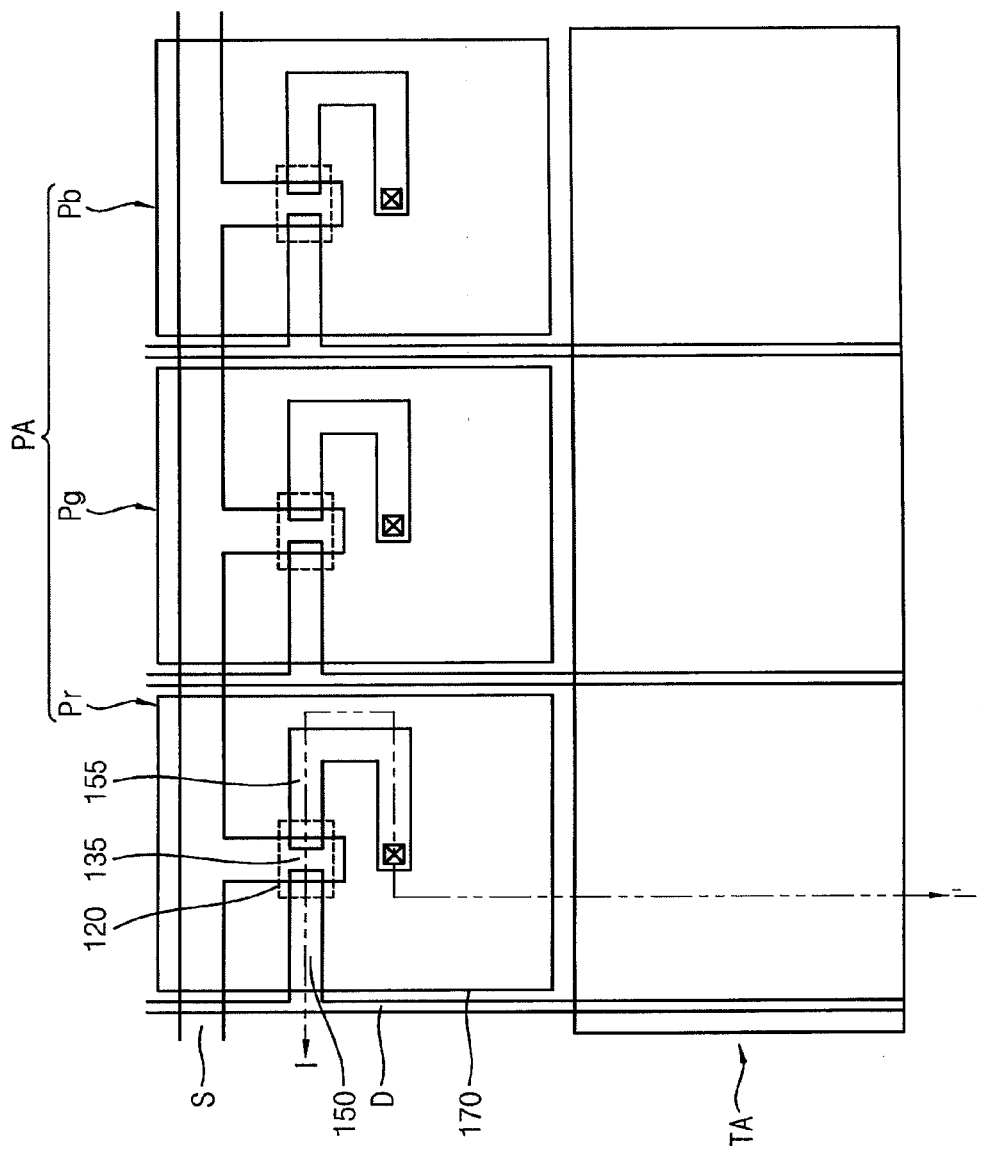
FIGS. 1 to 20 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. §112, first paragraph, and 35 U.S.C. §132(a).

The transparent display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the transparent display device may be formed on one integrated circuit (IC) chip or on separate IC chips. Further, the various components of the transparent display device may be implemented on a flexible printed circuit film, a tape carrier package (TCP), a printed circuit board (PCB), or formed on a same substrate. Further, the various components of the transparent display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
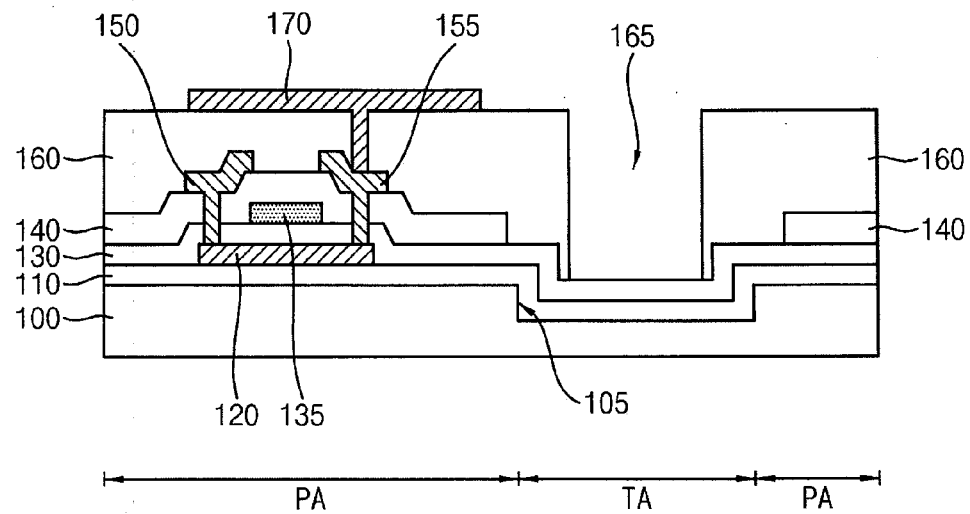

FIG. 1 is a schematic top plan view illustrating a transparent display substrate in accordance with some example embodiments of the present invention. FIG. 2 is a cross-sectional view illustrating a transparent display substrate in accordance with some example embodiments of the present invention. For example, FIG. 2 is a cross-sectional view taken along the line I-I' of FIG. 1.

Referring to FIGS. 1 and 2, the transparent display substrate may have a pixel area PA and a transmission area TA. For example, the transparent display substrate may be provided as a back-plane (BP) substrate for a transparent display device.

The pixel area PA may include a red pixel Pr, a green pixel Pg, and a blue pixel Pb, which may be repeatedly and alternately arranged to be adjacent to each other. The transmission area TA may be adjacent to the pixel area PA. As illustrated in FIG. 1, the transmission area TA may continuously extend to be adjacent to the red pixel Pr, the green pixel Pg, and the blue pixel Pb. In an embodiment, the transmission area TA may be individually patterned for each pixel.

In example embodiments, a pixel circuit for generating an image may be also disposed at the pixel area PA. An external light may be transmitted through the transmission area TA so that an external image may be observed therethrough.

A transistor, e.g., a thin film transistor (TFT) may be disposed in each pixel, and the transistor may be electrically connected to a data line D and a scan line S. As illustrated in FIG. 1, the data line D and the scan line S may cross each other, and the each pixel may be defined at a crossing region of the data line D and the scan line S. A pixel circuit may be defined by the data line D, the scan line S and the transistor.

The pixel circuit may further include a power line (Vdd) that may be parallel to the date line D. Additionally, a capacitor electrically connected to the power line and the transistor may be disposed in the each pixel.

FIGS. 1 and 2 illustrate only one transistor, however, at least two transistors may be disposed per each pixel. For example, a switching transistor and a driving transistor may be disposed per each pixel. The capacitor may be interposed between the switching transistor and the driving transistor, and may be electrically connected to the switching and driving transistors.

As illustrated in FIG. 2, the transistor and the capacitor may be disposed on a portion of a barrier layer 110 formed at the pixel area PA of a base substrate 100. The transistor may include an active pattern 120, a gate insulation layer 130, a gate electrode 135, a source electrode 150, and a drain electrode 155. A via insulation layer 160 may cover the transistor, and a pixel electrode 170 may be disposed on the via insulation layer 160 to be electrically connected to the drain electrode 155 of the transistor.

A transparent insulation substrate may be utilized as the base substrate 100. For example, the base substrate 100 may include a polymer-based material having transmissive and flexible properties. In this case, the transparent display substrate may serve as a display substrate implemented in a flexible transparent display device. For example, the base substrate 100 may include polyimide, polysiloxane, an epoxy-based resin, an acryl-based resin, polyester, and/or the like. In an embodiment, the base substrate 100 may include polyimide.

The base substrate 100 may be divided into the pixel area PA and the transmission area TA as described above.

In example embodiments, the base substrate 100 may include a recess 105 formed in the transmission area TA. Thus, a thickness of the base substrate 100 in the transmission area TA may be smaller than a thickness of the base substrate 100 in the pixel area PA.

In some embodiments, the thickness of the base substrate 100 in the transmission area TA may range from about ¼ to about ½ of the thickness of the base substrate 100 in the pixel area PA. A thickness ratio of the transmission area TA relative to the pixel area PA may be controlled to be smaller than about ½ so that a sufficient transmittance in the transmission area TA may be achieved. The thickness ratio may be controlled to be greater than about ¼ so that a detachment failure of the base substrate 100 from a carrier substrate 50 (see FIG. 9) may be avoided.

The barrier layer 110 may be formed conformally along a top surface of the base substrate 100 (e.g., the barrier layer 110 may conform to or match the shape of the top surface of the base substrate 100). An inner wall of the recess 105 may be covered by the barrier layer 110. Moistures penetrating through the base substrate 100 may be blocked by the barrier layer 110, and an impurity diffusion between the base substrate 100 and structures thereon may be also blocked by the barrier layer 110.

For example, the barrier layer 110 may include silicon oxide, silicon nitride, silicon oxynitride, and/or the like. These may be used alone or in a combination thereof. In an embodiment, the barrier layer 110 may have a multi-layered structure including a silicon oxide layer and a silicon nitride layer.

The active pattern 120 may be disposed on the portion of the barrier layer 110 formed at the pixel area PA.

The active pattern 120 may include a silicon compound such as polysilicon. In some embodiments, a source region and a drain region including p-type or n-type impurities may be formed at both ends of the active pattern 120.

In some embodiments, the active pattern may include an oxide semiconductor such as indium gallium zinc oxide (IGZO), zinc tin oxide (ZTO), indium tin zinc oxide (ITZO), and/or the like. In this case, a transmittance of the transparent display substrate may be improved (e.g., increased).

The gate insulation layer 130 may be formed on the barrier layer 110, and may cover the active pattern 120. In example embodiments, the gate insulation layer 130 may include silicon oxide, silicon nitride, silicon oxynitride, and/or the like. These may be used alone or in a combination thereof. The gate insulation layer 130 may have a multi-layered structure including a silicon oxide layer and a silicon nitride layer.

The gate insulation layer 130 may extend commonly and continuously at the pixel area PA and the transmission area TA in a similar profile to that of the barrier layer 110. For example, the gate insulation layer 130 may be formed conformally on the inner wall of the recess 105.

The gate electrode 135 may be disposed on the gate insulation layer 130. The gate electrode 135 may be substantially superimposed over (e.g., substantially cover) the active pattern 120 with respect to the gate insulation layer 130 (e.g., the gate electrode 135 may partially cover the active pattern 120).

The gate electrode 135 may be electrically connected to the scan line S. For example, as illustrated in FIG. 1, the gate electrode 135 may be diverged from (e.g., extend out or protrude from) the scan line S.

The gate electrode 135 may include a metal, an alloy, or a metal nitride. For example, the gate electrode 135 may include a metal such as aluminum (Al), silver (Ag), tungsten (W), copper (Cu), nickel (Ni), chromium (Cr), molybdenum (Mo), titanium (Ti), platinum (Pt), tantalum (Ta), neodymium (Nd) and scandium (Sc), an alloy thereof, and/or a nitride thereof. These may be used alone or in a combination thereof. The gate electrode 135 may include at least two metal layers having different physical and/or chemical properties. For example, the gate electrode 135 may have a double-layered structure such as an Al/Mo structure or a Ti/Cu structure.

An insulating interlayer 140 may be formed on the gate insulation layer 130, and may cover the gate electrode 135. The insulating interlayer 140 may include silicon oxide, silicon nitride, and/or silicon oxynitride. These may be used alone or in a combination thereof. The insulating interlayer 140 may have a multi-layered structure including a silicon oxide layer and/or a silicon nitride layer.

In example embodiments, the insulating interlayer 140 may be substantially excluded from the transmission area TA, and may be selectively provided at the pixel area PA (e.g., the insulating interlayer 140 may only exist in the pixel area PA).

The source electrode 150 and the drain electrode 155 may extend through the insulating interlayer 140 and the gate insulation layer 130 to be in contact with the active pattern 120. The source electrode 150 and the drain electrode 155 may include a metal such as Al, Ag, W, Cu, Ni, Cr, Mo, Ti, Pt, Ta, Nd, and/or Sc, an alloy thereof, or a nitride thereof. These may be used alone or in a combination thereof. The source electrode 150 and the drain electrode 155 may include at least two different metal layers such as an Al layer and a Mo layer.

The source electrode 150 and the drain electrode 155 may be in contact with the source region and the drain region, respectively, of the active pattern 120. A portion of the active pattern 120 between the source region and the drain region may serve as a channel through which charges may be moved or transferred.

The source electrode 150 may be electrically connected to the data line D. For example, the source electrode 150 may be diverged from (e.g., extend out or protrude from) the data line D.

FIG. 2 illustrates that the transistor has a top gate structure in which the gate electrode 135 overlies the active pattern 120. However, the transistor may have a bottom gate structure in which the gate electrode 135 is disposed under the active pattern 120.

The via insulation layer 160 may be formed on the insulating interlayer 140 and the gate insulation layer 130, and may cover the source electrode 150 and the drain electrode 155. A via structure electrically connecting the pixel electrode 170 and the drain electrode 155 to each other may be accommodated in the via insulation layer 160. The via insulation layer 160 may have a substantially planar or leveled top surface, and may serve as a planarization layer of the transparent display substrate.

The via insulation layer 160 may include an organic material, e.g., polyimide, an epoxy-based resin, an acryl-based resin, polyester, and/or the like.

In example embodiments, the via insulation layer 160 may include an opening 165 at the transmission area TA. The opening 165 may substantially overlap the recess 105 included in the base substrate 100. Accordingly, a top surface of the gate insulation layer 130 formed in the recess 105 may be exposed through the opening 165.

In some embodiments, the via insulation layer 160 may substantially fully cover a top surface and a sidewall of the insulating interlayer 140. The via insulation layer 160 may also cover a portion of the gate insulation layer 130 formed on a sidewall of the recess 105. Accordingly, the transmittance of the transparent display substrate may be improved (e.g., increased) by the opening 165 at the transmission area TA, while a function of the via insulation layer 160 as the planarization layer may be sufficiently maintained.

The pixel electrode 170 may be disposed on the via insulation layer 160, and may include the via structure extending through the via insulation layer 160 to be in contact with or electrically connected to the drain electrode 155. The pixel electrode 170 may be selectively disposed at the pixel area PA, and may be individually provided per each pixel.

In an embodiment, the pixel electrode 170 may include a transparent conductive material having a high work function. For example, the pixel electrode 170 may include indium tin oxide (ITO), indium zinc oxide (IZO), zinc oxide, or indium oxide. In this case, the transmittance of the transparent display substrate may be further improved (e.g., increased).

In an embodiment, the pixel electrode 170 may serve as a reflective electrode. In this case, the pixel electrode 170 may include a metal, e.g., Al, Ag, W, Cu, Ni, Cr, Mo, Ti, Pt, Ta, Nd or Sc, and/or an alloy thereof.

In an embodiment, the pixel electrode 170 may have a multi-layered structure including the transparent conductive material and the metal.

According to example embodiments as described above, the recess 105 may be formed at the base substrate 100 of the transmission area TA. Thus, a loss of transmittance caused by, e.g., a polymer material such as polyimide may be reduced in a remaining portion of the transparent display substrate except for an image displaying area. Further, a transmissive efficiency (e.g., a transmission efficiency) at the transmission area TA may be improved (e.g., increased) by the opening 165 overlapping the recess 105.

In example embodiments, the transmission area TA may include the number of insulation layers and an insulation thickness less than those of the pixel area PA. For example, as illustrated in FIG. 2, an insulation structure including the base substrate 100, the barrier layer 110, the gate insulation layer 130, the insulating interlayer 140, and the via insulation layer 160 may be disposed at the pixel area PA. However, an insulation structure consisting essentially of the base substrate 100 having a reduced thickness, the barrier layer 110, and the gate insulation layer 130 may be disposed at the transmission area TA. Therefore, a light transmitting distance may be reduced at the transmission area TA so that the transmittance of the transparent display substrate may be improved.

Figure 3:
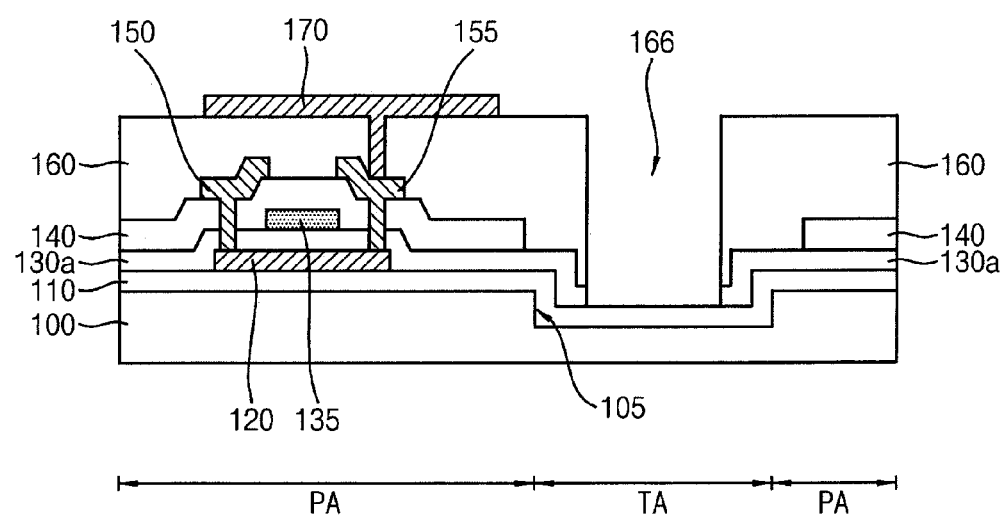
Figure 4:
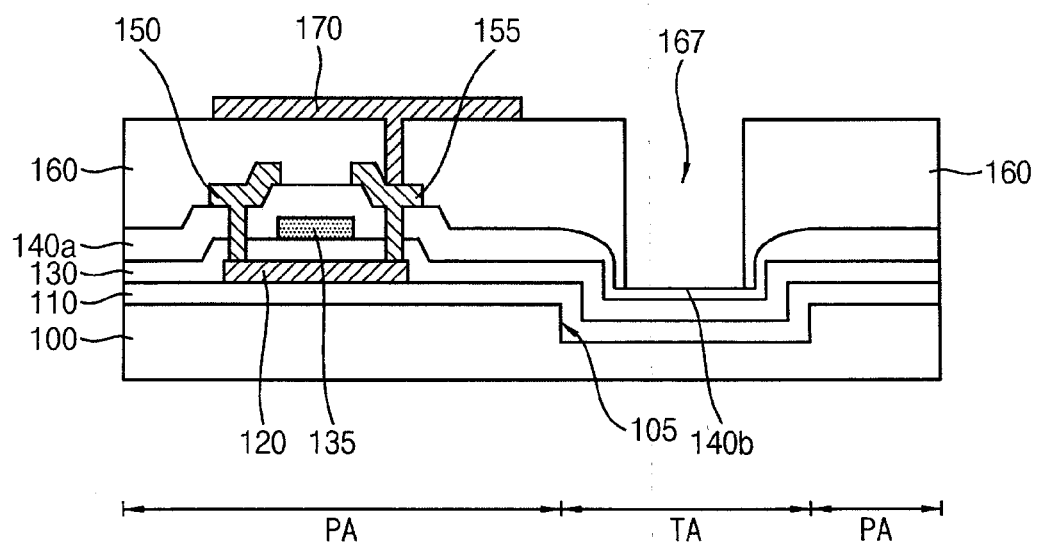
Figure 5:
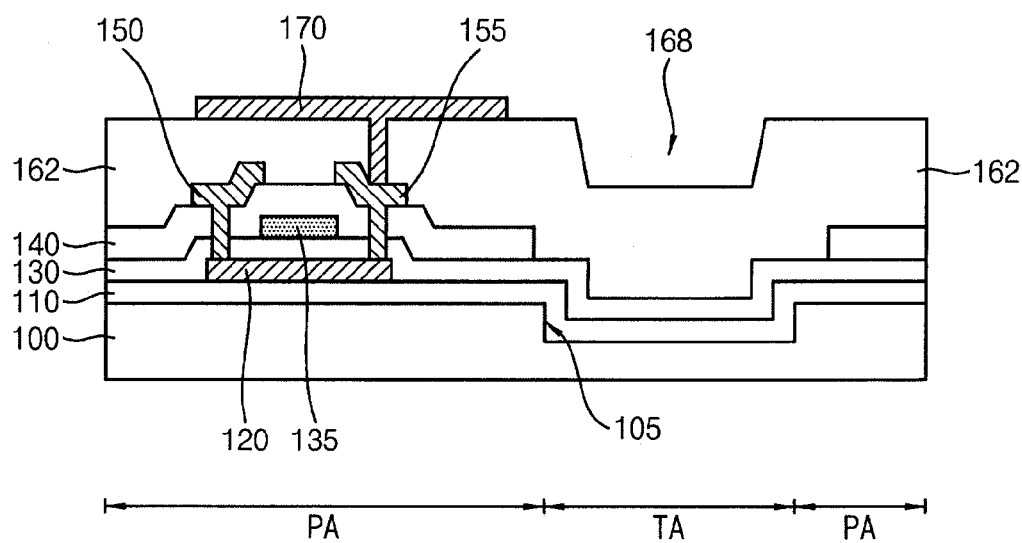

FIGS. 3 to 5 are cross-sectional views illustrating transparent display substrates in accordance with some example embodiments of the present invention.

Detailed descriptions of elements and/or constructions that are substantially the same as or similar to those illustrated with reference to FIG. 2 may not be provided herein, and like reference numerals are used to designate like elements.

Referring to FIG. 3, a recess 105 may be formed at a portion of a base substrate 100 at a transmission area TA such that a thickness of the portion of the base substrate 100 may be decreased. A barrier layer 110 may be formed conformally on a top surface of the base substrate 100 and an inner wall of the recess 105.

A gate insulation layer pattern 130a may cover an active pattern 120 at a pixel area PA, and may be cut or intersected by an opening 166 defined at the transmission area TA (e.g., the opening 166 may create a separation in the gate insulation pattern 130a).

In some embodiments, the gate insulation layer pattern 130a may be substantially disposed selectively at the pixel area PA, and may extend partially in the recess 105 at the transmission area TA. For example, the gate insulation layer pattern 130a may cover a sidewall of the recess 105, and a top surface of the barrier layer 110 may be exposed through a bottom of the opening 166. For example, the opening 166 may be inserted in the recess 105.

An gate electrode 135 may be disposed on the gate insulation layer pattern 130a to be superimposed over (e.g., partially cover) the active pattern 120. An insulating interlayer 140 may cover the gate electrode 135 at the pixel area PA, and may be substantially excluded from the transmission area TA.

A source electrode 150 and a drain electrode 155 may extend through the insulating interlayer 140 and the gate insulation layer pattern 130a to be in contact with the active pattern 120. A via insulation layer 160 may be formed on the insulating interlayer 140 and the gate insulation layer pattern 130a, and may cover the source and drain electrodes 150 and 155.

In some embodiments, a sidewall of the opening 166 may be defined by sidewalls of the via insulation layer 160 and the gate insulation layer pattern 130a.

A pixel electrode 170 may extend through the via insulation layer 160 to be electrically connected to the drain electrode 155.

As described above, a gate insulation layer may be substantially removed from the transmission area TA, such that a length or a height of the opening 166 may become greater than that of the opening 165 illustrated in FIG. 2. Thus, a light transmitting distance may be further reduced so that a transmittance may be further enhanced (e.g., increased).

Referring to FIG. 4, an insulating interlayer 140 may be divided into a first portion 140a substantially formed at a pixel area PA, and a second portion 140b formed on an inner wall of a recess 105 at a transmission area TA. In some embodiments, the second portion 140b may have a thickness smaller than that of the first portion 140a.

The second portion 140b of the insulating interlayer 140 may be exposed through a bottom of an opening 167. Thus, an insulation structure including a base substrate 100, a barrier layer 110, a gate insulation layer 130, the first portion 140a of the insulating interlayer 140 and a via insulation layer 160 may be disposed at the pixel area PA. An insulation structure consisting essentially of the base substrate 100 having a reduced thickness, the barrier layer 110, the gate insulation layer 130 and the second portion 140b of the insulating interlayer 140 having a reduced thickness may be disposed at the transmission area TA. Thus, a light transmitting distance may be reduced at the transmission area TA so that an overall transmittance may be enhanced.

Referring to FIG. 5, a via insulation layer 162 may extend commonly at a pixel area PA and a transmission area TA.

A via insulation layer 162 may have a substantially planer top surface at the pixel area PA. A portion of the via insulation layer 162 at the transmission area TA may include a concave portion 168 created by a recess 105.

Accordingly, an insulation structure including a base substrate 100 having a reduced thickness and the via insulation layer 162 of which a thickness may be reduced by the concave portion 168 may be disposed at the transmission area TA. Thus, a light transmitting distance may be reduced at the transmission area TA so that an overall transmittance may be enhanced.

Figure 6:
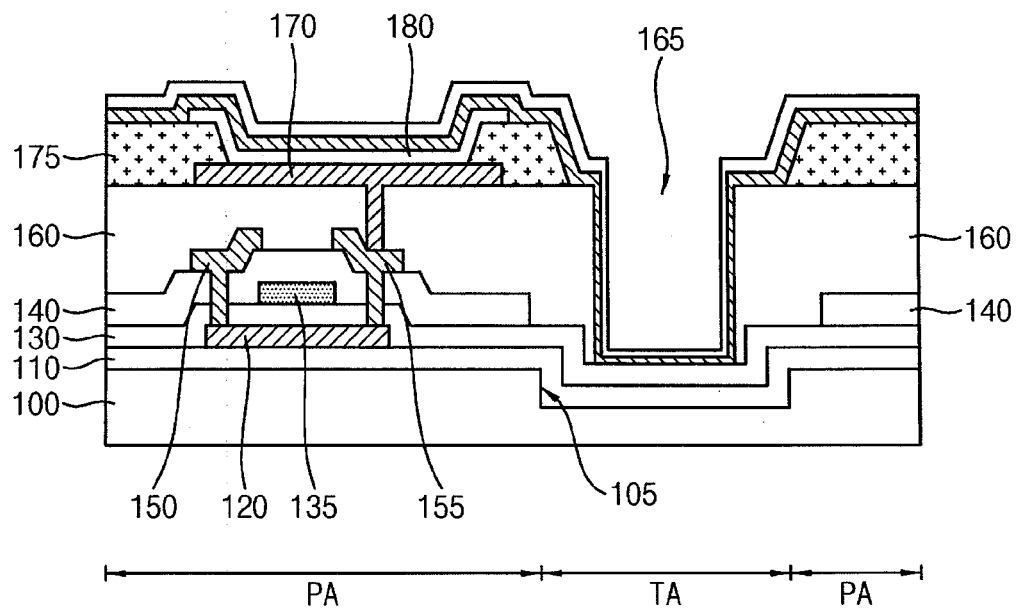

FIG. 6 is a cross-sectional view illustrating a transparent display device in accordance with some example embodiments of the present invention. For example, FIG. 6 illustrates an organic light emitting display (OLED) device including the transparent display substrate illustrated with reference to FIGS. 1 to 5.

Detailed descriptions on elements and/or constructions that are substantially the same as or similar to those illustrated with reference to FIGS. 1 to 5 may not be provided herein, and like reference numerals are used to designate like elements.

Referring to FIG. 6, transparent display device may include a display layer 180, an opposing electrode 190 and an encapsulation film 195 stacked on the transparent display substrate illustrated with reference to FIG. 1. Additionally, a pixel defining layer (PDL) 175 may be disposed on a portion of the via insulation layer 160 at the pixel area PA such that the pixel electrode 170 of each pixel may be at least partially exposed.

For example, the PDL 175 may cover a peripheral portion of the pixel electrode 170. The PDL 175 may include a transparent organic material such as polyimide or an acryl-based resin. An area which may not be covered by the PDL 175 may be substantially equal to a light emitting area of the each pixel.

The display layer 180 may be disposed on the PDL 175 and the pixel electrode 170. The display layer 180 may include an organic emitting layer patterned individually for a red pixel Pr, a green pixel Pg and a blue pixel Pb to generate a different color at each pixel. The organic emitting layer may include a host material excited by holes and electrons, and a dopant material facilitating an emitting efficiency through absorbing and releasing energy.

In some embodiments, the display layer 180 may further include a hole transport layer (HTL) between the pixel electrode 170 and the organic emitting layer. The display layer 180 may further include an electron transport layer (ETL) between the opposing electrode 190 and the organic emitting layer.

The HTL may include a hole transport material, e.g., 4,4'-bis[N-(1-naphtyl)-N-phenylamino]biphenyl (NPB), 4,4'-bis[N-(3-methylphenyl)-N-phenylamino]biphenyl (TPD), N,N'-di-1-naphtyl-N,N'-diphenyl-1,1'-biphenyl-4,4'-diamine (NPD), N-phenylcarbazole, polyvinylcarbazole, or a combination thereof.

The ETL may include an electron transport material, e.g., tris(8-quinolinolato)aluminum (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), triazole (TAZ), phenylquinozaline, or a combination thereof.

In some embodiments, the display layer 180 may include a liquid crystal layer instead of the organic emitting layer. In this case, the transparent display device may be provided as an LCD device.

The display layer 180, as illustrated in FIG. 6, may be formed on a sidewall of the PDL 175, and a top surface of the pixel electrode 170 exposed by the PDL 175. The display layer 180 may be also extended on a top surface of the PDL 175. In some embodiments, the display layer 180 may be confined by the sidewall of the PDL 175, and may be individually provided per each pixel.

The opposing electrode 190 may be formed on the PDL 175 and the display layer 180. The opposing electrode 190 may face the pixel electrode 170 with respect to the display layer 180.

In some embodiments, the opposing electrode 190 may serve as a common electrode commonly provided for a plurality of pixels (e.g., the plurality of pixels may share the same common electrode). The pixel electrode 170 and the opposing electrode 190 may serve as an anode and a cathode, respectively, of the transparent display device.

The opposing electrode 190 may include a metal, such as Al, Ag, W, Cu, Ni, Cr, Mo, Ti, Pt, Ta, Nd or Sc, or an alloy thereof. In an embodiment, the opposing electrode 190 may include a transparent conductive material such as ITO, IZO, zinc oxide, indium oxide, and/or the like.

In example embodiments, the opposing electrode 190 may extend commonly and continuously at the pixel area PA and the transmission area TA. For example, the opposing electrode 190 may be formed conformally on surfaces of the PDL 175 and the display layer 180, and an inner wall of the opening 165.

In some embodiments, a portion of the opposing electrode 190 at the transmission area TA may have less thickness (e.g., be thinner) than that at the pixel area PA because of a stepped portion created by the opening 165. Accordingly, a loss of transmittance by the opposing electrode 190 may be reduced at the transmission area TA.

In some embodiments, the transparent display device may be a top emission type in which an image may be created toward the opposing electrode 190. In this case, the pixel electrode 170 may serve as a reflective electrode including the metal, and the opposing electrode may include the transparent conductive material such as ITO. Accordingly, a transmittance at the transmission area TA may not be substantially deteriorated (e.g., reduced).

The encapsulation film 195 may be formed on the opposing electrode 190 to protect the transparent display device. The encapsulation film 195 may include an inorganic material such as silicon nitride, a metal oxide, and/or the like. In some embodiments, a capping layer may be further formed between the opposing electrode 190 and the encapsulation film 195. The capping layer may include an organic material, such as polyimide, an epoxy resin or an acryl resin, etc., or an inorganic material such as silicon oxide, silicon nitride or silicon oxynitride, etc.

Figure 7:
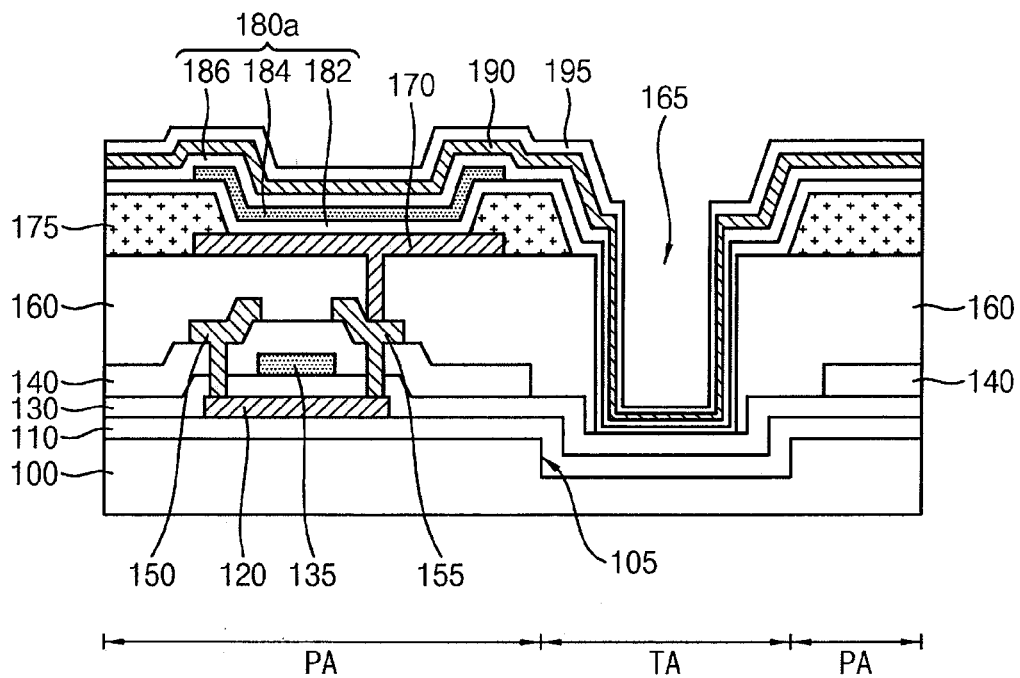
Figure 8:
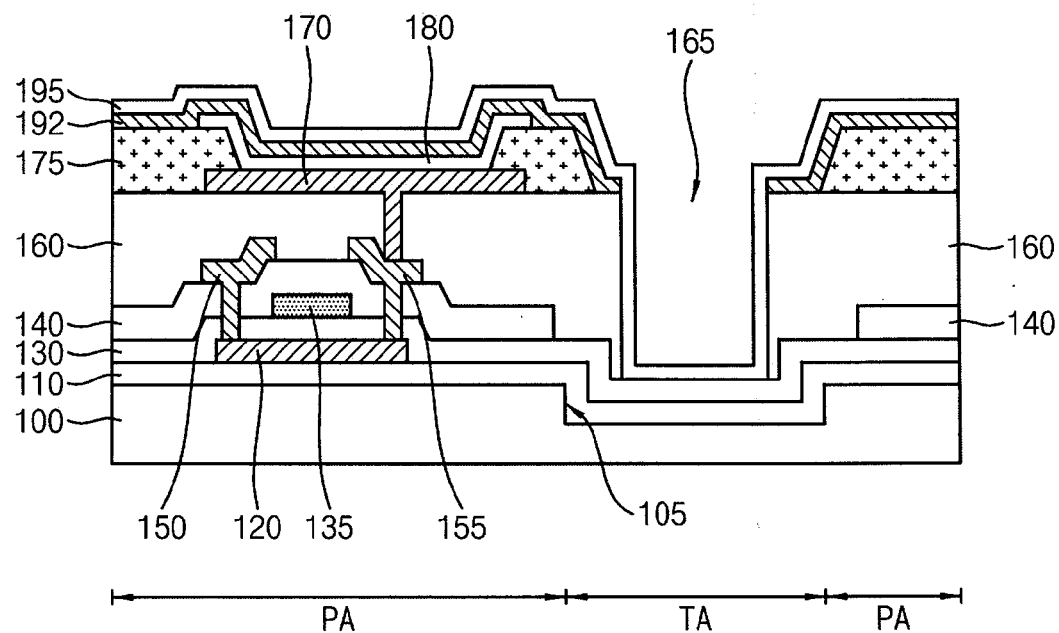

FIGS. 7 and 8 are cross-sectional views illustrating transparent display devices in accordance with some example embodiments of the present invention. Detailed descriptions on elements and/or constructions that are substantially the same as or similar to those of the embodiment of FIG. 6 may not be provided herein.

Referring to FIG. 7, a display layer 180a may include a HTL 182, an organic emitting layer 184, and an ETL 186 sequentially stacked on a top surface of the pixel electrode 170.

In example embodiments, the HTL 182 and the ETL 186 may be formed commonly and continuously at the pixel area PA and the transmission area TA. For example, the HTL 182 and the ETL 186 may be formed conformally on surfaces of the PDL 175 and the pixel electrode 170, and an inner wall of the opening 165. In some embodiments, the HTL 182 and the ETL 186 may be commonly provided on a plurality of pixels included in the pixel area PA.

The organic emitting layer 184 may be selectively disposed at the pixel area PA. For example, the organic emitting layer 184 may be substantially superimposed over (e.g., substantially cover) the pixel electrode 170, and may be individually patterned per each pixel. The organic emitting layer 184 may be sandwiched between the HTL 182 and the ETL 186.

An opposing electrode 190 and an encapsulation film 195 may be provided commonly and continuously at the pixel area PA and the transmission area TA as illustrated in FIG. 6.

Referring to FIG. 8, and also as illustrated in FIG. 6, a display layer 180 may be patterned per each pixel at the pixel area PA.

An opposing electrode 192 may be selectively provided at the pixel area PA, and may not extend in the opening 165. Accordingly, an insulation structure consisting essentially of the base substrate 100 (having a reduced thickness by the opening 165), the barrier layer 110, and the gate insulation layer 130 may be disposed at the transmission area TA exposed through the opening 165, and a light emitting structure, such as the display layer 180 and the opposing electrode 192, may not be disposed at the transmission area TA (which is exposed through the opening 165). Therefore, a transmitting efficiency at the transmission area TA may be further improved (e.g., increased) due to a decrease of a light transmitting distance.

In some embodiments, an encapsulation film 195 may be commonly provided at the pixel area PA and the transmission area TA. For example, the encapsulation film 195 may be formed conformally on a top surface of the opposing electrode 192, and on a sidewall and a bottom of the opening 165.

FIGS. 6 to 8 illustrate that the transparent display devices includes the transparent display substrate of the embodiment of FIG. 2. However, the transparent display devices may include the transparent display substrates of the embodiments of FIGS. 3 to 5. For example, the light emitting structures illustrated with reference to FIGS. 6 to 8 may be combined with the transparent display substrates illustrated with reference to FIGS. 3 to 5 so that a display device having an improved transmittance may be achieved.

FIGS. 9 to 20 are cross-sectional views illustrating a method of manufacturing a transparent display device in accordance with some example embodiments of the present invention.

Figure 9:
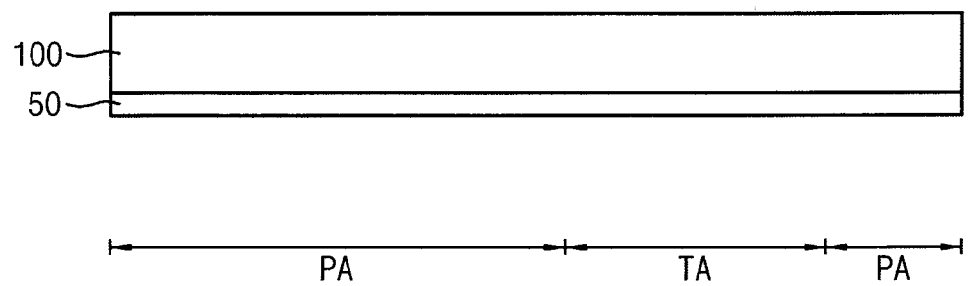

Referring to FIG. 9, a base substrate 100 may be formed on a carrier substrate 50.

The carrier substrate 50 may serve as a supporter of the base substrate 100 during a manufacturing process of the transparent display device. For example, a glass substrate or a metal substrate may be utilized as the carrier substrate 50.

The base substrate 100 may be formed using a transparent polymer resin such as a polyimide-based resin. For example, a precursor composition containing a polyimide precursor may be coated on the carrier substrate 50 by, e.g., a spin coating process to form a coating layer. The coating layer may be thermally cured to form the base substrate 100.

The polyimide precursor may include a diamine and a dianhydride. The precursor composition may be prepared by dissolving the polyimide precursor in an organic solvent. The organic solvent may include, e.g., N-methyl-2-pyrrolidone (NMP), dimethylformamide (DMF), tetrahydrofuran (THF), triethylamine (TEA), ethylacetate (ethylacetate), dimethylsulfoxide (DMSO), or an ethylene glycol-based ether solvent. These may be used alone or in a combination thereof.

The diamine and the dianhydride may be polymerized by the thermal curing process so that a polyamic acid may be created, and the polyamic acid may be additionally cured and condensed to form the polyimide-based resin.

A predetermined area of the base substrate may be allotted as a pixel area PA, and a remaining area except for the pixel area PA may be allotted as a transmission area TA.

Figure 10:
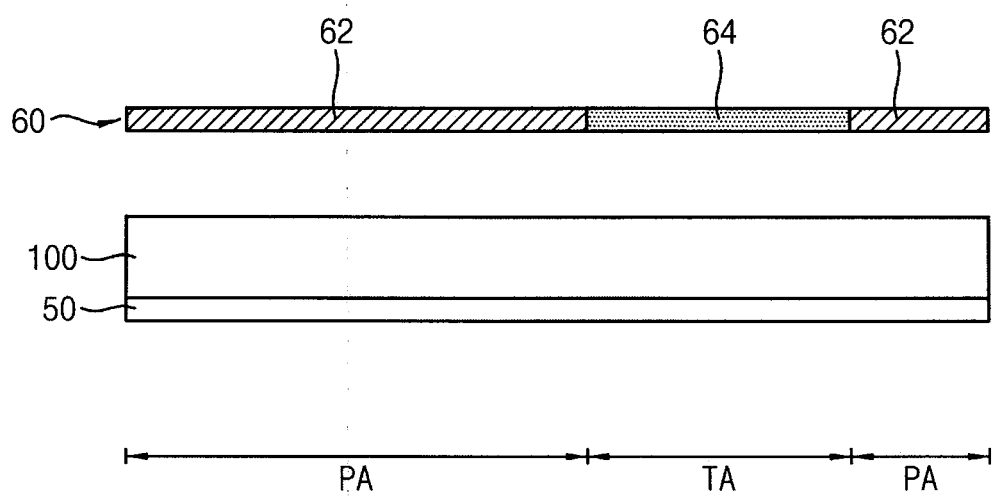

Referring to FIG. 10, a photo mask 60 may be placed over the base substrate 100.

In example embodiments, the photo mask 60 may be a half-tone mask including a light-shielding portion 62 and a transflective portion 64. The transflective portion 64 of the photo mask 60 may be substantially superimposed over (e.g., substantially cover) the base substrate 100 of the transmission area TA.

Figure 11:
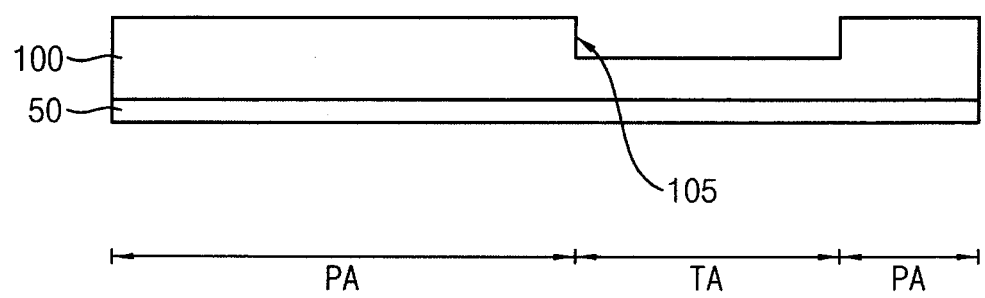

Referring to FIG. 11, an exposure process may be performed using the photo mask 60 to remove an upper portion of the base substrate 100 of the transmission area TA. Accordingly, a recess 105 may be formed at the base substrate 100 of the transmission area TA, such that the base substrate 100 may have a reduced thickness in the transmission area TA.

For example, a molecular structure of the base substrate 100 in the transmission area TA may be modified by the exposure process, and then a developing process may be performed to remove the upper portion of the base substrate 100 of the transmission area TA.

In example embodiments, a depth of focus through the transflective portion 64 may be controlled while performing the exposure process so that a removal amount of the base substrate 100 in the transmission area TA may be adjusted. A depth of the recess 105 may be controlled in consideration of a sufficient transmittance in the transmission area TA and a detachment of the base substrate 100 from the carrier substrate 50. In some embodiments, the depth of the recess 105 may be controlled in a range from about ½ to about ¾ of an initial thickness of the base substrate 100.

Figure 12:
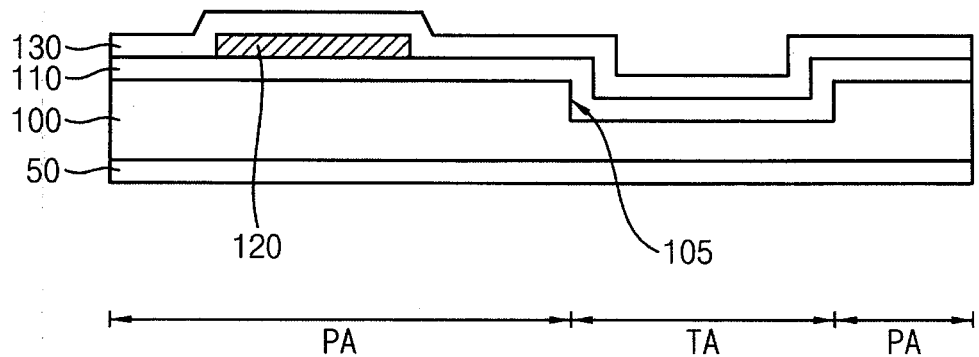

Referring to FIG. 12, a barrier layer 110, an active pattern 120 and a gate insulation layer 130 may be sequentially formed on the base substrate 100.

The barrier layer 110 may substantially cover an entire top surface of the base substrate 100, and may be formed conformally on an inner wall of the recess 105. The barrier layer 110 may be formed of silicon oxide, silicon nitride and/or silicon oxynitride.

The active pattern 120 may be formed on a portion of the barrier layer 110 at the pixel area PA. For example, a semiconductor layer including amorphous silicon or polysilicon may be formed on the barrier layer 110, and then may be patterned to form the active pattern 120.

In some embodiments, a crystallization process, e.g., a low temperature polycrystalline silicon (LTPS) process or a laser crystallization process may be further performed after the formation of the semiconductor layer.

In some embodiments, the semiconductor layer may be formed of a oxide semiconductor such as IGZO, ZTO, ITZO, and/or the like.

The gate insulation layer 130 covering the active pattern 120 may be formed on the barrier layer 110. The gate insulation layer 130 may extend continuously at the pixel area PA and the transmission area TA, and may be formed conformally along the inner wall of the recess 105. The gate insulation layer 130 may be formed of silicon oxide, silicon nitride, silicon oxynitride, and/or the like.

Figure 13:
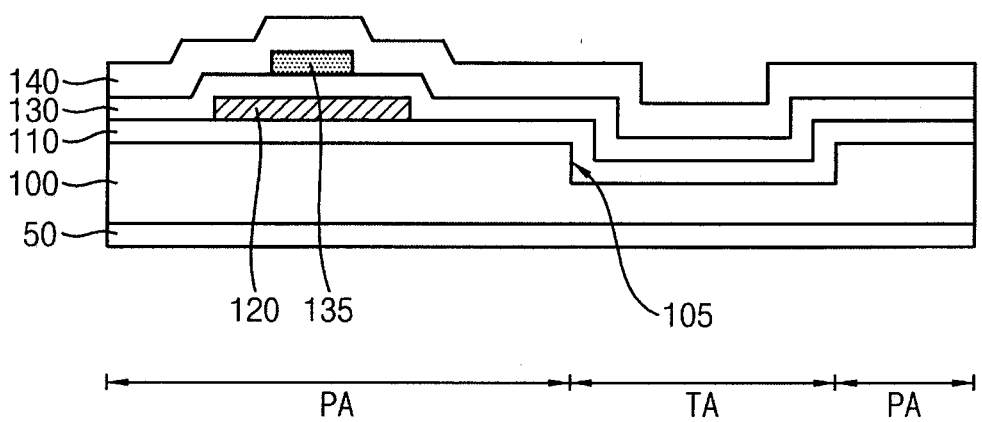

Referring to FIG. 13, a gate electrode 135 and an insulating interlayer 140 may be formed on the gate insulation layer 130.

For example, a first conductive layer may be formed on the gate insulation layer 130. The first conductive layer may be patterned by, e.g., a photolithography process to form the gate electrode 135. The first conductive layer may be formed using a metal, an alloy, a metal nitride, and/or the like. The first conductive layer may be formed by depositing a plurality of metal layers.

The gate electrode 135 may be substantially superimposed over (e.g., partially or substantially cover) the active pattern 120. In some embodiments, the gate electrode 135 may be formed together with a scan line S illustrated in FIG. 1. For example, the gate electrode 135 and the scan line S may be formed from the first conductive layer by substantially the same etching process, and the scan line S may be integral with the gate electrode 135.

In some embodiments, impurities may be implanted into the active pattern 120 using the first gate electrode 135 as an ion-implantation mask such that a source region and a drain region may be formed at both ends of the active pattern 120.

The insulating interlayer 140 covering the gate electrode 135 may be formed on the gate insulation layer 130. The insulating interlayer 140 may include a protrusion and a concave portion according to stepped portions created by the gate electrode 135 and the recess 105. The insulating interlayer 140 may be formed of silicon oxide, silicon nitride, silicon oxynitride, and/or the like.

Figure 14:
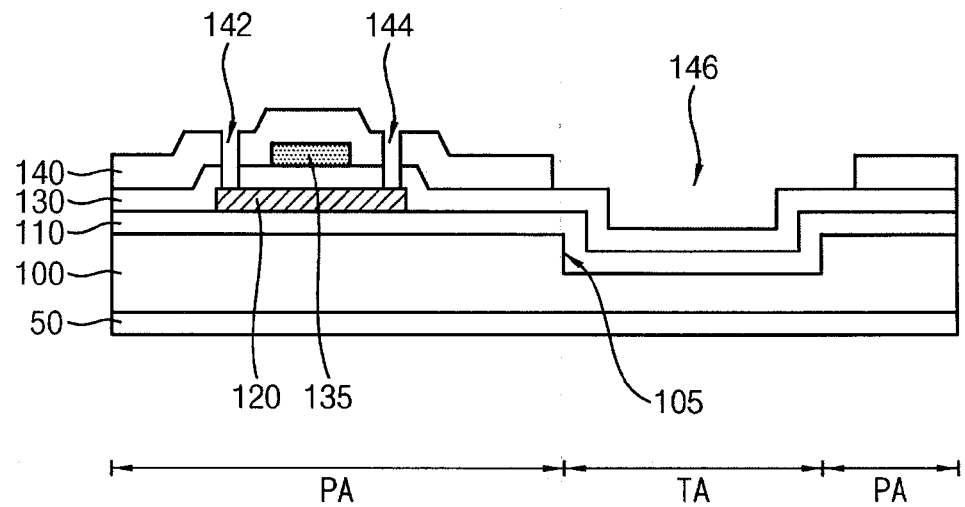

Referring to FIG. 14, the insulating interlayer 140 may be partially removed to form a first contact hole 142, a second contact hole 144, and a trench 146.

In example embodiments, the first contact hole 142, the second contact hole 144, and the trench 146 may be formed by substantially the same photo process using a single etching mask.

The first contact hole 142 and the second contact hole 144 may be formed through the insulating interlayer 140 and the gate insulation layer 130 such that a top surface of the active pattern 120 may be partially exposed. For example, the source region and the drain region of the active pattern 120 may be exposed through the first contact hole 142 and the second contact hole 144, respectively.

The trench 146 may substantially encompass the transmission area TA. For example, a portion of the gate insulation layer 130 formed at the transmission area TA may be exposed through the trench 146. In some embodiments, the trench 146 may also cover a portion of the pixel area PA adjacent to the transmission area TA. For example, the trench 146 may have a width greater than a width of the recess 105 included in the base substrate 100.

In some embodiments, as illustrated in FIG. 4, the insulating interlayer 140 may be formed conformally on a top surface of the gate insulation layer 130 and the inner wall of the recess 105. For example, the insulating interlayer 140 may include a first portion 140a substantially formed at the pixel area PA, and a second portion 140b formed in the inner wall of the recess 105 and having a reduced thickness as described with reference to FIG. 4. In this case, the formation of the trench 146 may not be provided.

Figure 15:
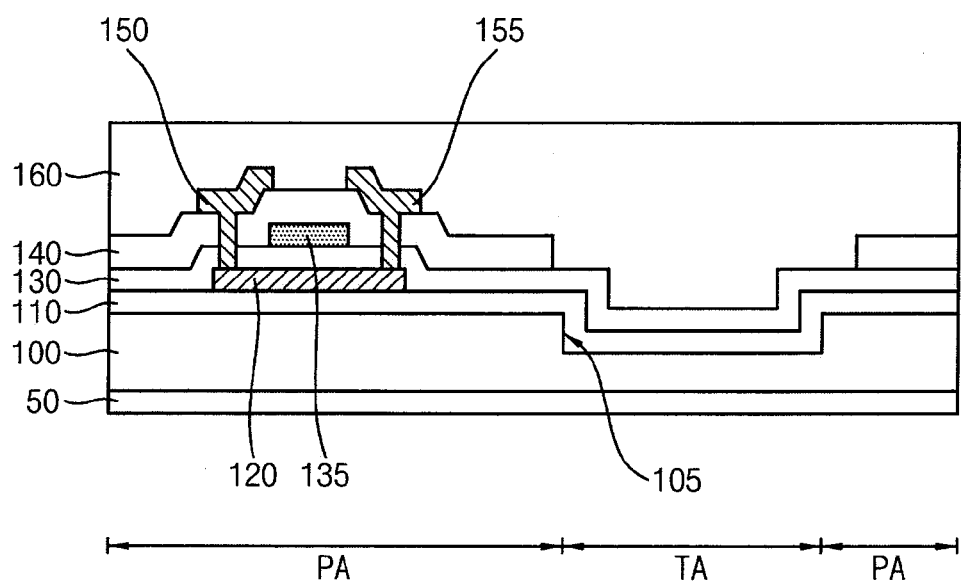

Referring to FIG. 15, a source electrode 150 and a drain electrode 155 may be formed in the first contact hole 142 and the second contact hole, respectively. The source electrode 150 and the drain electrode 155 may be in contact with the source region and the drain region, respectively.

For example, a second conductive layer sufficiently filling the first contact hole 142 and the second contact hole 144 may be formed on the insulating interlayer 140 and the gate insulation layer 130. The second conductive layer may be patterned by a photolithography process to form the source electrode 150 and the drain electrode 155. The second conductive layer may be formed using a metal, a metal nitride, an alloy, and/or the like.

Accordingly, a TFT including the active pattern 120, the gate insulation layer 130, the gate electrode 135, the source electrode 150, and the drain electrode 155 may be formed at the pixel area PA of the base substrate 100. For example, a plurality of pixels may be included in the pixel area PA, and at least one TFT may be formed per each pixel.

Additionally, a pixel circuit including the TFT, a data line D, and the scan line S may be formed on the base substrate 100. The source electrode 150 may be electrically connected to the data line D as illustrated in FIG. 1. For example, the source electrode 150, the drain electrode 155 and the data line D may be formed from the second conductive layer by substantially the same etching process.

A via insulation layer 160 may be formed to cover the insulating interlayer 140, the gate insulation layer 130, the source electrode 150, and the drain electrode 155. The via insulation layer 160 may sufficiently fill the trench 146 illustrated in FIG. 14, and may have a substantially leveled or planar top surface.

The via insulation layer 160 may be formed using an organic material, such as polyimide, an epoxy-based resin, an acryl-based resin, polyester and/or the like, by a spin coating process or a slit coating process.

Figure 16:
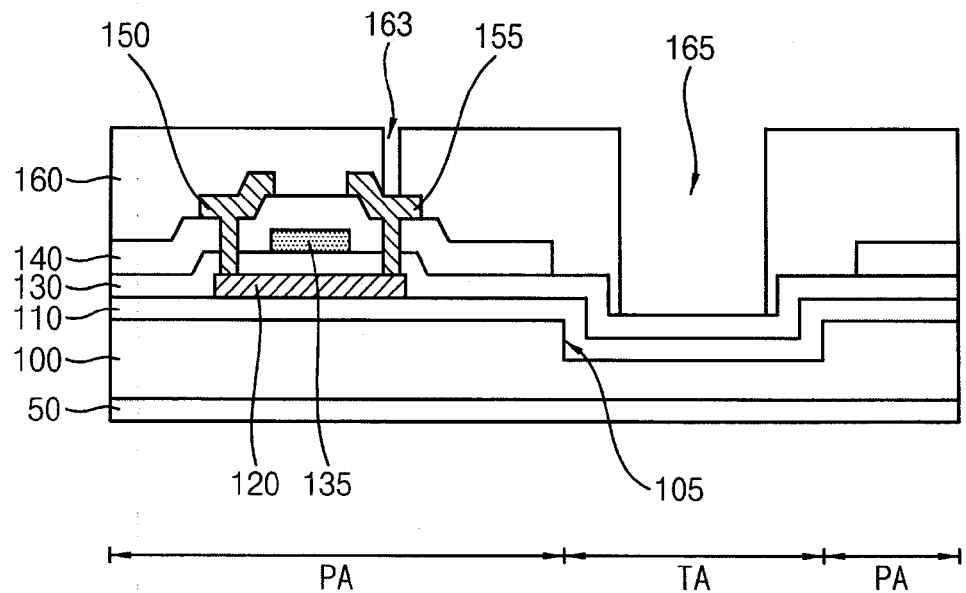

Referring to FIG. 16, the via insulation layer 160 may be partially removed to form a via hole (or a via opening) 163 and an opening 165. A top surface of the drain electrode 155 may be partially exposed through the via hole 163. The opening 165 may be formed at the transmission area TA, and may be connected to or merged with the trench 146 illustrated in FIG. 14. For example, a portion of the gate insulation layer 130 formed in the recess 105 may be exposed through a bottom of the opening 165.

The opening 165 may be substantially superimposed over (e.g., partially expose) the recess 105 formed in the base substrate 100. For example, the opening 165 may be inserted in the recess 105.

In example embodiments, the via hole 163 and the opening 165 may be formed by substantially the same photo process using a single etching mask.

In some embodiments, a portion of the gate insulation layer 130 exposed through the opening 165 may be further etched. In this case, the opening 166 having an increased depth may be formed as illustrated in FIG. 3.

In some embodiments, as illustrated in FIG. 5, the via insulation layer 162 having the concave portion 168 at the transmission area TA may be formed. In this case, the formation of the opening 165 illustrated in FIG. 16 may not be provided.

Figure 17:
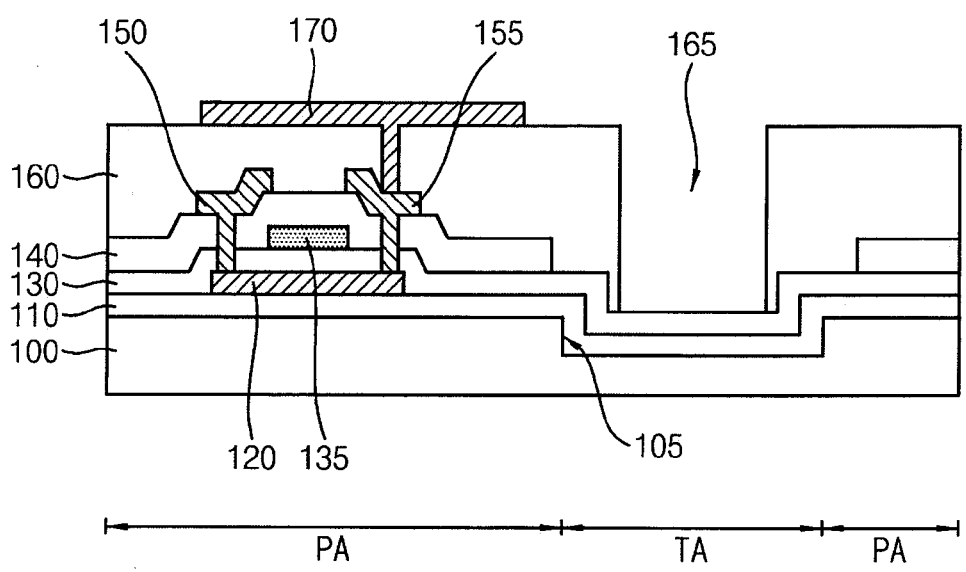

Referring to FIG. 17, a pixel electrode 170 filling the via hole 163 and electrically connected to the drain electrode 155 may be formed on the via insulation layer 160. Accordingly, a transparent display substrate according to example embodiments may be formed on the carrier substrate 50.

For example, a third conductive layer filling the via hole 163 may be formed on the via insulation layer 160, and then may be patterned to form the pixel electrode 170.

The third conductive layer may be formed of a metal, an alloy, a metal nitride, or a transparent conductive material such as ITO.

The barrier layer 110, the semiconductor layer, the gate insulation layer 130, the insulating interlayer 140, and the first to third conductive layers may be formed by at least one of a chemical vapor deposition (CVD) process, a plasma enhanced chemical vapor deposition (PECVD) process, a high density plasma-chemical vapor deposition (HDP-CVD) process, a thermal evaporation process, a vacuum deposition process, a spin coating process, a sputtering process, an atomic layer deposition (ALD) process, and a printing process.

Figure 18:
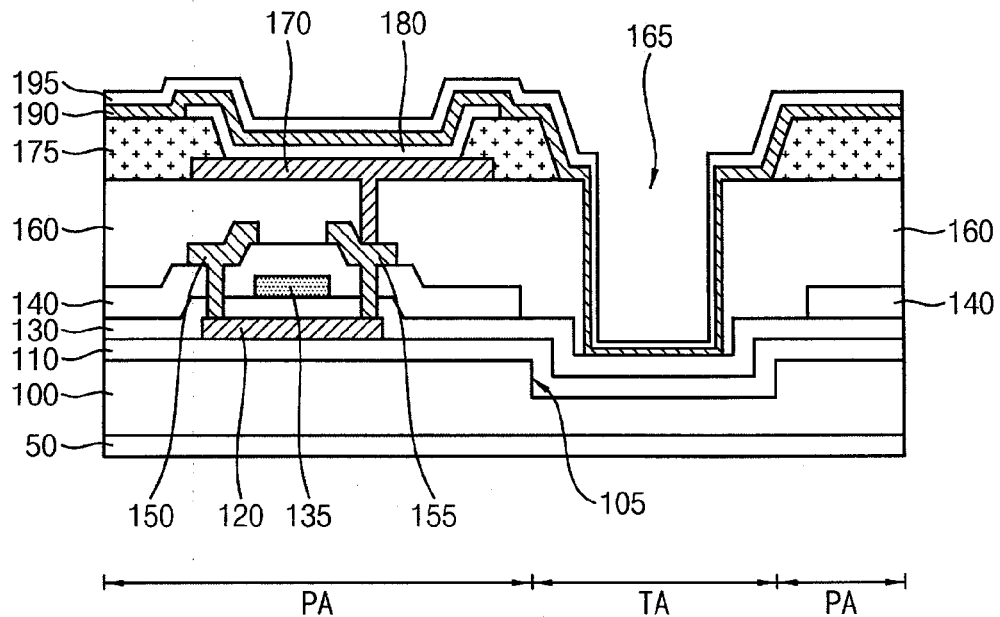

Referring to FIG. 18, a light emitting structure may be stacked on the transparent display substrate illustrated in FIG. 17.

A PDL 175 may be formed on a portion of the via insulation layer 160 at the pixel area PA, and may cover a peripheral portion of the pixel electrode 170. For example, a photosensitive organic material such as a polyimide resin or an acryl resin may be coated, and then exposure and developing processes may be performed to form the PDL 175.

A display layer 180 may be formed using an organic light emitting material for generating a red color of light, a blue color of light, or a green color of light on each pixel electrode 170 exposed by the PDL 175. For example, the display layer 180 may be formed by a spin coating process, a roll printing process, a nozzle printing process, an inkjet process, etc., using a fine metal mask (FMM) that may include an opening through which a region corresponding to a red pixel, a green pixel, or a blue pixel is exposed. Accordingly, an organic emitting layer including the organic light emitting material may be individually formed in each pixel.

In some embodiments, an HTL may be formed before the formation of the organic emitting layer using the above-mentioned hole transport material. An ETL may be also formed on the organic emitting layer using the above-mentioned electron transport material. The HTL and the ETL may be included in the display layer 180, and may be patterned per each pixel by processes substantially the same as or similar to those for the organic emitting layer.

A metal having a low work function such as Al, Ag, W, Cu, Ni, Cr, Mo, Ti, Pt, Ta, Nd and/or Sc, or an alloy of the metals may be deposited on the display layer 180 to form an opposing electrode 190. For example, an open mask including an opening through which the pixel area PA and the transmission area TA are commonly exposed may be used to deposit the metal by, e.g., a sputtering process for the formation of the opposing electrode 190.

In some embodiments, the opposing electrode 190 at the transmission area TA may have a thickness thinner than that at the pixel area PA due to an increased deposition distance caused by the opening 165.

An encapsulation film 195 may be formed on the opposing electrode 190 using an inorganic material such as silicon oxide, silicon nitride and/or a metal oxide. The encapsulation film 195 may continuously extend at the pixel area PA and the transmission area TA, and may be formed conformally along the inner wall of the opening 165.

The carrier substrate 50 may be detached from the base substrate 100 to achieve the transparent display device illustrated in, e.g., FIG. 6. A laser-lift process may be performed to separate the carrier substrate 50 from the base substrate 100. Alternatively, a mechanical tension may be applied to detach the carrier substrate 50 without performing the laser-lift process.

Figure 19:
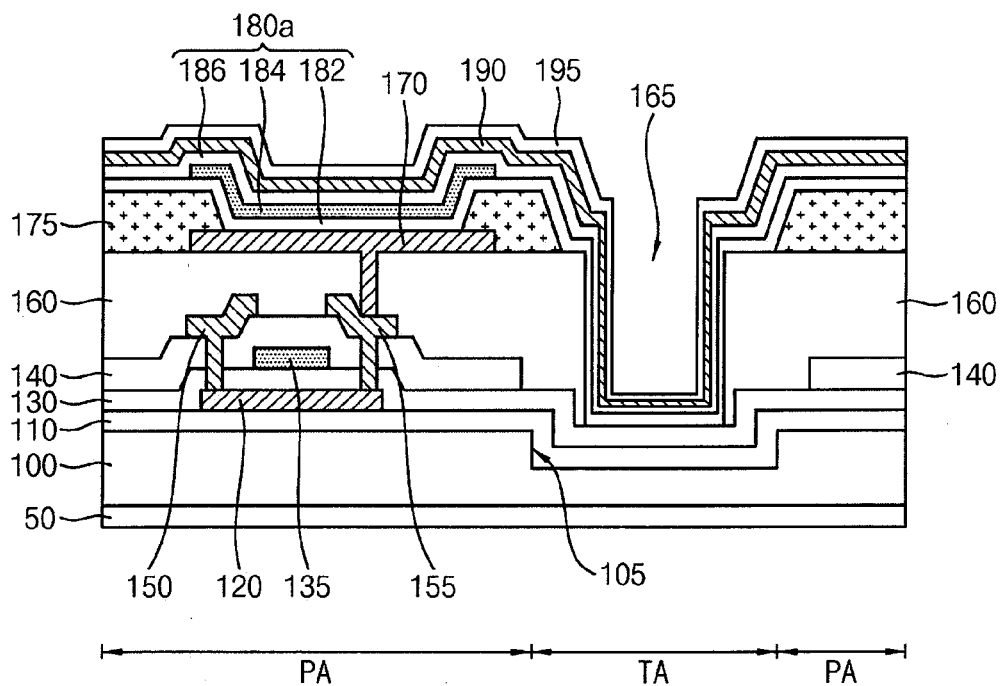

Referring to FIG. 19, in some example embodiments, a display layer 180a may include an HTL 182, an organic emitting layer 184 and an ETL 186 sequentially stacked on the transparent display substrate.

In some embodiments, the HTL 182 and the ETL 186 may be formed commonly and continuously at the pixel area PA and the transmission area TA. For example, the HTL 182 and the ETL 186 may be formed conformally along the inner wall of the recess 105 at the transmission area TA.

For example, the HTL 182 and the ETL 186 may be formed by printing or coating the hole transport material and the electron transport material as mentioned above, respectively, through an open mask commonly exposing the pixel area PA and the transmission area TA.

After the formation of the HTL 182, the organic emitting layer 184 may be formed by printing an organic light emitting material through a fine metal mask selectively exposing each pixel at the pixel area PA.

In some embodiments, the opposing electrode 190 and the encapsulation film 195 may be also formed commonly and continuously at the pixel area PA and the transmission area TA as illustrated in FIG. 18.

The carrier substrate 50 may be detached from the base substrate 100 to achieve the transparent display device illustrated in, e.g., FIG. 7.

Figure 20:
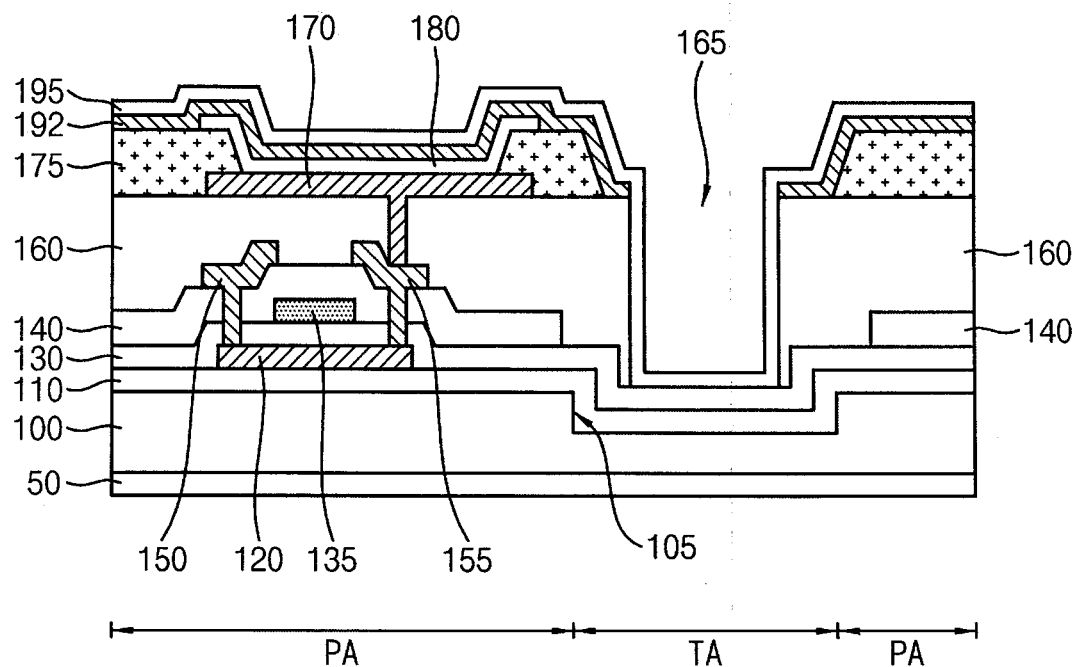

Referring to FIG. 20, in some example embodiments, a display layer 180 may be individually patterned per each pixel as illustrated in FIG. 18, and an opposing electrode 192 may be formed selectively at the pixel area PA. Accordingly, the opposing electrode 192 may not be substantially formed in the opening 165 of the transmission area TA.

For example, a metal or a transparent conductive material may be deposited on the PDL 175 and the display layer 180 through a fine metal mask selectively exposing the pixel area PA to form the opposing electrode 192.

In some embodiments, a deposition control layer may be formed on the inner wall of the opening 165 using a material having a poor affinity with respect to the metal or the transparent conductive material. In this case, the opposing electrode 192 may not be substantially formed in the opening 165 by a repulsive force from the deposition control layer even though the metal or the transparent conductive material may be provided commonly at the pixel area PA and the transmission area TA through an open mask. Thus, the opposing electrode 192 may be formed selectively at the pixel area PA.

An encapsulation film 195 may be formed commonly and continuously at the pixel area PA and the transmission area TA. The encapsulation film 195 may be in contact with the opposing electrode 192 at the pixel area PA, and may be in contact with the inner wall of the opening 165 at the transmission area TA.

The carrier substrate 50 may be detached from the base substrate 100 to achieve the transparent display device illustrated in, e.g., FIG. 8.

According to example embodiments of the present inventive concepts, an upper portion of a base substrate at a transmission area of a transparent display substrate may be removed. Accordingly, the base substrate may have less thickness at the transmission area than at a pixel area. Thus, a light transmitting distance at the transmission area may be decreased, and a loss of transmittance by the base substrate including, e.g., polyimide may be reduced (e.g., minimized). A transparent display device having an improved transmittance (e.g., a high transmittance) may be obtained utilizing the transparent display substrate.

The foregoing is illustrative of example embodiments and is not to be construed as limiting thereof. Although a few example embodiments have been described, those skilled in the art will readily appreciate that many modifications are possible in the example embodiments without materially departing from the novel teachings and aspects of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that various suitable modifications to the disclosed example embodiments, as well as other example embodiments, are intended to be included within the scope of the appended claims, and equivalents thereof.

What is claimed is:

1. A transparent display substrate comprising:
a base substrate having a pixel area and a transmission area, a thickness of the base substrate at the transmission area being less than a thickness of the base substrate at the pixel area;
a pixel circuit at the pixel area of the base substrate;
an insulation structure covering the pixel circuit, the insulation structure having an opening or a concave portion at the transmission area of the base substrate; and
a pixel electrode at the pixel area of the base substrate and extending at least partially through the insulation structure to be electrically connected to the pixel circuit.

2. The transparent display substrate of claim 1, wherein the base substrate comprises a transparent polymer material selected from polyimide, polysiloxane, an epoxy-based resin, and polyester.

3. The transparent display substrate of claim 1, wherein the thickness of the base substrate at the transmission area is about ¼ to about ½ of the thickness of the base substrate at the pixel area.

4. The transparent display substrate of claim 1, wherein the insulation structure comprises a barrier layer, a gate insulation layer, an insulating interlayer, and a via insulation layer sequentially stacked from a top surface of the base substrate,
wherein the pixel circuit comprises:
an active pattern on the barrier layer;
a gate electrode on the gate insulation layer, the gate electrode being over the active pattern; and
a source electrode and a drain electrode extending through the insulating interlayer and the gate insulation layer to be electrically connected to the active pattern, and
wherein the pixel electrode extends through the via insulation layer.

5. The transparent display substrate of claim 4, wherein the barrier layer and the gate insulation layer extend commonly and continuously at the pixel area and the transmission area,
wherein the insulating interlayer is at the pixel area,
wherein the via insulation layer covers a top surface and a sidewall of the insulating interlayer, and
wherein the opening is formed through the via insulation layer.

6. The transparent display substrate of claim 4, wherein the barrier layer extends commonly and continuously at the pixel area and the transmission area,
wherein the insulating interlayer is at the pixel area,
wherein the via insulation layer covers a top surface and a sidewall of the insulating interlayer,
wherein the opening is formed through the via insulation layer, and
wherein the opening creates a gap in the gate insulation layer at the transmission area.

7. The transparent display substrate of claim 4, wherein the barrier layer, the gate insulation layer, and the insulating interlayer extend commonly and continuously at the pixel area and the transmission area,
wherein the insulating interlayer has relatively less thickness at the transmission area than the pixel area,
wherein the opening is through the via insulation layer, and
wherein a portion of the insulating interlayer having relatively less thickness is exposed through the opening.

8. The transparent display substrate of claim 4, wherein the via insulation layer comprises the concave portion at the transmission area.

9. The transparent display substrate of claim 4, wherein the base substrate has a recess at the transmission area, and
wherein the barrier layer extends along an inner wall of the recess and partially fills the recess.

10. A transparent display device comprising:
a base substrate having a pixel area and a transmission area, the base substrate having a recess in the transmission area;
a pixel circuit at the pixel area of the base substrate;
an insulation structure covering the pixel circuit and having an opening or a concave portion over the recess;
a pixel electrode at the pixel area of the base substrate and extending at least partially through the insulation structure to be electrically connected to the pixel circuit;
a display layer on the pixel electrode; and
an opposing electrode opposite the pixel electrode on the display layer.

11. The transparent display device of claim 10, wherein the opposing electrode extends continuously at the pixel area and the transmission area, and
wherein a portion of the opposing electrode on an inner wall of the opening has less thickness than a remaining portion of the opposing electrode.

12. The transparent display device of claim 10, wherein the display layer comprises a hole transport layer, an organic emitting layer and an electron transport layer sequentially stacked on the pixel electrode,
wherein the hole transport layer and the electron transport layer extend continuously at the pixel area and the transmission area, and conformally along an inner wall of the opening, and
wherein the organic emitting layer is at the pixel area.

13. The transparent display device of claim 10, wherein the opposing electrode and the display layer are at the pixel area.

14. The transparent display device of claim 13, further comprising an encapsulation film on the opposing electrode,
wherein the encapsulation film is in contact with an inner wall of the opening.

15. The transparent display device of claim 10, wherein the insulation structure comprises a plurality of layers, and
wherein a total thickness and a number of the plurality of layers at the transmission area are less than those of the plurality of layers at the pixel area.

16. The transparent display device of claim 10, wherein a depth of the recess is about ½ to about ¾ of a thickness of the base substrate.

17. A method of manufacturing a transparent display device, comprising:
forming a base substrate divided into a pixel area and a transmission area, the base substrate comprising a transparent polymer material;
removing an upper portion of the base substrate in the transmission area to form a recess;
forming a barrier layer along a top surface of the base substrate and an inner wall of the recess;
forming a pixel circuit on a portion of the barrier layer at the pixel area;
forming an insulation layer covering the pixel circuit on the barrier layer;
at least partially removing the insulation layer at the transmission area to form an opening;

forming a pixel electrode on a portion of the insulation layer at the pixel area, the pixel electrode being electrically connected to the pixel circuit;

forming a display layer on the pixel electrode; and forming an opposing electrode on the display layer.

18. The method of claim 17, wherein removing the upper portion of the base substrate in the transmission area to form the recess comprises exposing a portion of the base substrate at the transmission area through a half-tone mask.

19. The method of claim 17, wherein the insulation layer comprises a gate insulation layer, an insulating interlayer, and a via insulation layer sequentially stacked on the barrier layer, wherein forming the pixel circuit comprises:

forming an active pattern on the barrier layer;

forming a gate electrode on the gate insulation layer, the gate electrode being over the active pattern;

partially removing the insulating interlayer and the gate insulation layer to form contact openings and a trench, the contact openings exposing the active pattern at the pixel area, the trench overlapping the recess at the transmission area; and forming a source electrode and a drain electrode filling the contact openings.

20. The method of claim 19, further comprising partially removing the via insulation layer to form a via opening through which the drain electrode is exposed, wherein the opening is formed in the via insulation layer to be connected to or merged with the trench, and the opening is formed together with the via opening by a same etching process.

* * * * *